United States Patent [19]

Williams et al.

[11] 4,168,432
[45] Sep. 18, 1979

[54] METHOD OF TESTING RADIATION HARDNESS OF A SEMICONDUCTOR DEVICE

[75] Inventors: Richard Williams, Princeton, N.J.; Murray H. Woods, Palo Alto, Calif.

[73] Assignee: RCA Corporation, New York, N.Y.

[21] Appl. No.: 869,639

[22] Filed: Jan. 16, 1978

[51] Int. Cl.² .............................................. G01T 1/22
[52] U.S. Cl. ................................... 250/370; 250/316; 324/158 T
[58] Field of Search ....................... 324/158 T, 158 D; 250/370, 326

[56] References Cited

U.S. PATENT DOCUMENTS

| 2,805,347 | 4/1957 | Haynes et al. | 324/158 T |
| 3,493,752 | 2/1970 | Jund et al. | 250/370 |
| 3,723,873 | 3/1973 | Witteles | 324/158 D |
| 3,748,579 | 7/1973 | Henry et al. | 324/158 D |
| 3,840,809 | 10/1974 | Yun | 324/158 D |
| 3,882,391 | 5/1975 | Liles | 324/158 D |
| 3,995,216 | 11/1976 | Yun | 324/158 D |

Primary Examiner—Harold A. Dixon
Attorney, Agent, or Firm—H. Christoffersen; D. S. Cohen

[57] ABSTRACT

A body of semiconductor material having a layer of an oxide on a surface thereof is subjected to a negative corona discharge in air to deposit a negative charge on the outer surface of the oxide. This results in an immobile positive charge at the interface between the oxide layer and the semiconductor body. The amount of this positive charge, which can be measured by standard MOS capacitance measurements, indicates the radiation hardness of the device.

6 Claims, 1 Drawing Figure

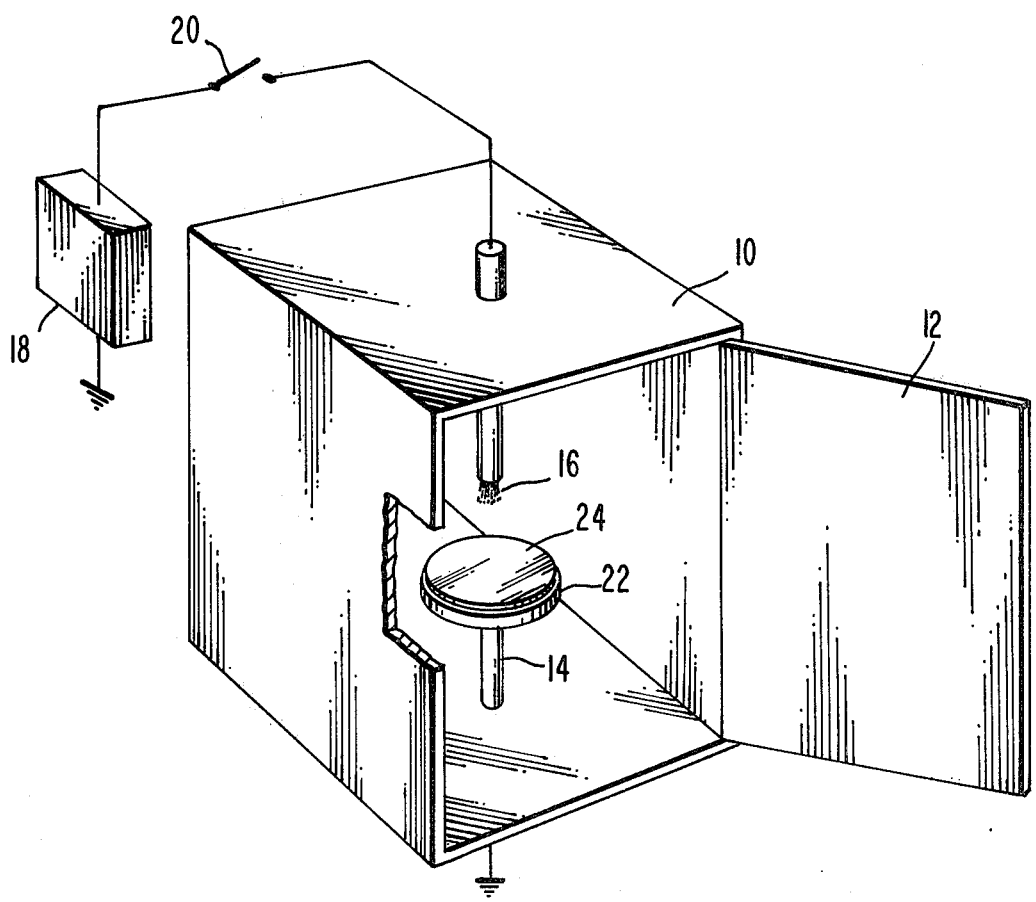

METHOD OF TESTING RADIATION HARDNESS OF A SEMICONDUCTOR DEVICE

The present invention relates to a method of testing the radiation hardness of a semiconductor device and particularly to such a method which is non-destructive to the device and can be carried out at any time during the processing of the device.

A characteristic of semiconductor devices, particularly those which include a layer of silicon oxide on a body of single crystalline silicon, which has received considerable attention is its resistance to dosages of radiation, i.e. the radiation hardness of the device. Radiation penetrating such a semiconductor device generates mobile electrons and holes in the silicon oxide. The holes are quickly trapped and immobilized near the interface of the silicon oxide and the silicon where their charge changes the electrical characteristics of the device. Various techniques have been developed for forming or treating the silicon oxide layer so as to improve the radiation hardness of the device. In order to determine the radiation hardness of a semiconductor device, it would be desirable to have a simple method of testing the device for radiation hardness. Particularly, it would be desirable to be able to test the device for radiation hardness immediately after the silicon oxide layer is formed on the surface of the semiconductor material to determine whether further processing should be carried out.

Thus the present invention relates to a method of determining the radiation hardness of a semiconductor device which includes a body of semiconductor material having a layer of an oxide on a surface thereof. The method includes the step of creating a high but non-destructive electric field across the oxide layer so as to ionize hole trapping centers near the interface and leaving behind immobile positive charges. The shift in the flat-band voltage is then determined. This shift is proportional to the concentration of hole traps and signifies the susceptibility to radiation of the device.

The FIGURE of the drawing is a perspective schematic view of an apparatus suitable for carrying out the method of the present invention.

We have discovered that charging a layer of silicon oxide on a body of single crystalline silicon with negative corona produces the same effect as bombardment with a high energy radiation from a VandeGraff generator or electron source. The high energy radiation generates free electrons and holes in the oxide and the holes are then trapped near the interface between the oxide and the silicon body. This is the basic cause of radiation damage. We have discovered that negative corona produces the same effect by direct field ionization of the trapping centers near the interface between the oxide and the silicon body. We have found that the concentration and other properties of the trapped holes produced by the discharge are identical to the holes produced by high energy radiation. Thus, our method of testing the radiation hardness of a layer of silicon dioxide on the surface of a body of single crystalline silicon includes electrically connecting the silicon body to ground potential and subjecting the oxide layer to a negative corona discharge in air. The amount of positive charge left at the interface between the silicon oxide and the silicon body is measured by standard MOS capacitance measurements. The flat-band voltage $V_{fb}$, shifts as a result of the corona charging, and for a given oxide thickness, the amount of shift of the flat-band voltage is proportional to the concentration of hole traps. Thus, the shift in the flat-band voltage determine the susceptibility to radiation of the silicon oxide layer; the smaller the shift, the less susceptible to damage is the silicon oxide layer.

Referring to the drawing, there is schematically shown an apparatus suitable for carrying out the method of the present invention. The apparatus includes a chamber 10 having a door 12. Within the chamber 10 is a supporting pedestal 14 of an electrically conductive material which is electrically connected to ground. Mounted directly above the pedestal 14, several centimeters away, is a corona electrode 16. The corona electrode 16 is electrically connected to a power source 18 through a switch 20.

To test a semiconductor device, a body 22 of single crystalline silicon having a layer 24 of silicon oxide on a surface thereof is seated on the pedestal 14 with the oxide layer 24 facing the corona electrode 16. The door 12 is closed and a negative corona potential is supplied to the corona electrode 16. Although the exact value of the corona potential is not critical, typically between about $-6$ KV and $-15$ KV can be used. The flat-band voltage of the coated body is measured before and after it is subjected to the corona discharge by standard MOS capacitance measurements. A description of an automatic and rapid method for measuring the flat-band voltage is described in an article "AUTOMATIC DISPLAY OF MIS CAPACITANCE VERSUS BIAS CHARACTERISTICS" by K. H. Zaininger, RCA REVIEW, September 1966, Vol. XXVII, No. 3.

Thus, the method of the present invention is a simple, quick, inexpensive and non-destructive method for determining the radiation hardness of a layer of silicon oxide on a body of single crystal silicon. This test can be made immediately after the silicon oxide is formed on the body of single crystalline silicon so that the radiation hardness of the device can be determined before further processing steps are carried out to make semiconductor devices in the semiconductor body. If the oxide layer does not have the desired radiation hardness it can possibly be treated to improve its radiation hardness before the further processing is carrier out. However, even if the radiation hardness of the oxide layer cannot be improved, the time and expense of further processing is saved by not utilizing that particular body of semiconductor material.

What is claimed is:

1. A method of determining the radiation hardness of a semiconductor device which includes a body of semiconductor material having a layer of an oxide on a surface thereof comprising the steps of:
    (a) creating by a corona discharge a high but non-destructive electric field across the oxide layer so as to ionize hole trapping centers near the interface between the oxide layer and the body and leave behind immobile positive charges, and
    (b) determining the shift in the flat-band voltage which is proportional to the concentration of hole traps and signifies the susceptibility to radiation of the device.

2. The method in accordance with claim 1 in which the radiation hardness of the semiconductor device is determined immediately after the oxide layer is formed on the semiconductor body.

3. The method in accordance with claim 1 in which the corona discharge is a negative corona discharge.

4. The method in accordance with claim 3 in which the oxide layer is subjected to the corona discharge in air.

5. The method in accordance with claim 4 in which step (b) is achieved by measuring the flat-band voltage before and after the oxide layer is subjected to the corona discharge.

6. The method in accordance with claim 4 in which the semiconductor body is silicon and the oxide is silicon oxide.

* * * * *